(12) United States Patent
Asano et al.

(10) Patent No.: US 6,891,690 B2
(45) Date of Patent: May 10, 2005

(54) ON-DRIVE INTEGRATED SECTOR FORMAT RAID ERROR CORRECTION CODE SYSTEM AND METHOD

(75) Inventors: Hideo Asano, Machida (JP); Martin Aureliano Hassner, Mountain View, CA (US); Nyles Norbert Heise, San Jose, CA (US); Steven R. Hetzler, Los Altos, CA (US); Tetsuya Tamura, Kanagawa (JP)

(73) Assignee: International Business Machines Corporation, Armonk, NY (US)

( * ) Notice: Subject to any disclaimer, the term of this patent is extended or adjusted under 35 U.S.C. 154(b) by 302 days.

(21) Appl. No.: 10/301,151

(22) Filed: Nov. 20, 2002

(65) Prior Publication Data

US 2004/0095666 A1 May 20, 2004

(51) Int. Cl.[7] ................................................ G11B 5/09
(52) U.S. Cl. ............................................ 360/53; 714/6
(58) Field of Search ...................... 360/53, 48; 711/114; 714/6, 800, 7, 801, 701, 769, 770

(56) References Cited

U.S. PATENT DOCUMENTS

| 4,495,623 A | 1/1985 | George et al. |
| 4,916,701 A | 4/1990 | Eggenberger |
| 5,388,105 A | 2/1995 | Takagi et al. |
| 5,734,663 A | 3/1998 | Eggenberger |
| 5,737,344 A | 4/1998 | Belser et al. |
| 6,807,642 B2 * | 10/2004 | Yamamoto et al. ............ 714/6 |

FOREIGN PATENT DOCUMENTS

EP        1067695 A2       1/2001

OTHER PUBLICATIONS

"Storage Data Revival System Without Extra H/W," Research Disclosure, Jan. 1999.

* cited by examiner

*Primary Examiner*—Alan T. Faber
(74) *Attorney, Agent, or Firm*—Samuel A. Kassatly

(57) ABSTRACT

An encoding system and associated method protect against miscorrection due to parity sector correction in, for example, an on-drive RAID system. The system adds a parity cluster block, which itself is a complete, C3-protected cluster. Having the cluster level, C4 level correction, by parity sectors, checked and verified by C3 checks that have high reliability level, as well as the capability for checking consistency of a cluster block, even in the presence of "jami" errors, makes this possibility unlikely. A scrub algorithm avoids read-modify-write operations by deferring the completion of the C2 and C3-ckecks until the storage device is idle.

45 Claims, 7 Drawing Sheets

| 921 | 922 | 923 | 924 | 925 | 926 | 927 | 928 |
|---|---|---|---|---|---|---|---|
| 0 | 0 | 1 | 0 | 0 | 0 | 0 | 0 |

ON-DRIVE INTEGRATED SECTOR FORMAT RAID ERROR CORRECTION CODE SYSTEM AND METHOD

CROSS-REFERENCE TO RELATED APPLICATION

The present application relates to copending U.S. patent application Ser. No. 10/040,115, filed on Jan. 3, 2002, and titled "Multiple Level (ML), Integrated Sector Format (ISF), Error Correction Code (ECC) Encoding And Decoding Processes For Data Storage Or Communication Devices And Systems," which is assigned to the same assignee of the present application, and which is incorporated herein by reference in its entirety.

FIELD OF THE INVENTION

The present invention relates generally to data storage or communication devices and systems, and particularly to an integrated sector format (ISF), error correction code (ECC) encoding and decoding processes for data storage or communication devices and systems. More specifically, the present invention relates to a system and associated method for protecting against miscorrection due to parity sector correction in an on-drive RAID system.

BACKGROUND OF THE INVENTION

In data storage devices and systems such as, for example, hard disk drives (HDD), the combination of poor write/read conditions and low signal-to-noise ratio (SNR) data detection is likely to cause a mixed error mode of long bursts of errors and random errors in data sectors stored on the disk. Typically, byte-alphabet, Reed-Solomon (RS) codes are used to format the stored sector data bytes into codewords protected by redundant check bytes and used to locate and correct the byte errors in the codewords.

Long codewords are more efficient for data protection against long bursts of errors as the redundant check byte overhead is averaged over a long data block. However, in data storage devices, long codewords cannot be used, unless a read-modify-write (RMW) process is used because the present logical unit data sector is 512 bytes long and the present computer host operating systems assume a 512-byte long sector logical unit.

Each RMW process causes a loss of a revolution of the data storage medium. Losing revolutions of the data storage medium lowers input/output (I/O) command throughput. Therefore, frequent usage of the RMW process becomes prohibitive because it lowers I/O command throughput.

The combination of low SNR detection and poor write/read conditions may result in both random errors as well as long bursts of byte errors ("mixed error mode") becoming more and more likely at high areal densities and low flying heights, which is the trend in HDD industry. The occurrence of such mixed error mode combinations of random as well as burst errors is likely to cause the 512-byte sector interleaved OTF ECC to fail resulting in a more frequent use of a data recovery procedure (DRP) which involves rereads, moving the head, etc.

These DRP operations result in the loss of disk revolutions that causes a lower input/output (I/O) throughput. This performance loss is not acceptable in many applications such as audio-visual (AV) data transfer, for example, which will not tolerate frequent interruptions of video data streams. On the other hand, uniform protection of all single sectors against both random as well as burst errors, at the 512-byte logical unit sector format, would result in excessive and unacceptable check byte overheads. Such check byte overheads also increase the soft error rate due to the increase in linear density of the data.

Long block data ECC, such as 4 K byte physical block comprising eight sectors, for example, could be a solution for some applications, but it would require a change in the operating system standard, unless read-modify-write (RMW) is accepted when writing single 512-byte sectors. Present operating systems are all based on a 512-byte long sector logical unit. RMW is required to update the long physical block check bytes. Thus, when a single 512-byte sector is written, the other sectors in the long block need to be read, the long block check bytes need to be recalculated, and the whole long block is then rewritten. Hence, the RMW causes an I/O throughput performance loss that is generally unacceptable for typical HDD operation.

Therefore, it would be desirable to have an ECC format for a data storage device that has a low sector failure rate for the mixed error mode of random error and burst error, that avoids frequent DRP or RMW use, and that also has an acceptable check byte overhead. Accordingly, there is a need for a multiple level (ML), integrated sector format (ISF), error correction code (ECC) encoding and decoding process for data storage devices and systems or communication devices and systems. A system and associated method that satisfy this need have been disclosed in U.S. patent application Ser. No. 10/040,115, supra.

A problem that is specifically associated with the present invention is the possibility of complete loss of a part, or the whole, of for example one 8-sector data cluster within a cluster block. As an illustration, the cluster block can be comprised of 16 data clusters. The problem with replacing an unreadable or erased sector (or sectors) with a parity sector in a parity cluster, such as an on-drive Raid-5 system, is the lack of verification that the parity sectors are consistent with the data clusters in the cluster block. What is therefore still needed, is a function capable of checking the reliability of parity sector correction across a cluster block against miscorrection.

Another specific problem relates to the odd-boundary-write operation. Odd-boundary-write operation is a write operation that does not begin at the first Logical Block Address (LBA) of a physical 8-sector data cluster, or which does not end at the last LBA of a physical 8-sector data cluster. The completion of a second and a third level (C2/C3) encoding for an 8-sector data cluster, in the presence of an odd-boundary-write operation requires a Read-Modify-Write (RMW) operation.

For sequential writes, the frequency at which the Read-Modify-Write operation would be required is low, and the C2/C3 protection completion may thus not pose a considerable problem. However, for random writes the C2/C3 protection completion may not be acceptable from a performance viewpoint. There is therefore a need for avoiding the RMW operation, while concurrently completing the C2/C3-protection in an 8-sector data cluster, whose ISF Protection is fragmented by odd-boundary-write.

Yet another specific problem is the occurrence of a data erasure, a "jami," that can wipe out a sector written inside a data cluster, for which a C3-encoding has been completed. There is therefore a need to introduce a readability state of sectors within a data cluster, which is a byte that is "virtual." The readability state of sectors should not be actually written on the disk, but should be encoded into the C3-checks. The readability state of sectors should be updated and re-encoded into the C3-checks during the drive scrub operation, so that these C3-checks serve as miscorrection checks (i.e., CRC) for a higher level protection.

SUMMARY OF THE INVENTION

The present invention satisfies these needs, and presents a system, a computer program product, and an associated method (collectively referred to herein as "the system" or "the present system") for protecting against miscorrection due to parity sector updates in an ISF-ECC system in an on-drive parity sector system.

To this end, the system presents a cluster block to be protected by a parity cluster, which itself is a complete, C3-protected cluster. Effectively, this protection forms a fourth ISF protection level, referred to herein as "C4 level," "C4 protection," or "C4 correction," which is implemented as a multi-sector parity stripe on a cluster block.

The replacement of unreadable or erased sectors within a sector cluster, or of a complete cluster, by parity sectors, or by a parity cluster, requires a means of checking for miscorrection, and a guarantee that the parity sectors (or parity clusters) are consistent with the data in the cluster block, to avoid the risk of providing the customer with incorrect or "bad" data.

Having the cluster level, C4 level correction, by parity sectors, checked and verified by C3 checks that have high reliability level, as well as the capability for checking consistency of a cluster block, even in the presence of "jami" errors, makes this possibility unlikely.

More specifically, the present invention teaches the use of the ISF-ECC C3-check bytes, within an 8-sector data cluster, as Cycle Redundancy Checks (CRC's), that certify whether the individual data cluster pertains to a C4-protected cluster block. If a sector, or several sectors, have been written within a data cluster and the C2/C3-check bytes have been updated, but the C4-parity cluster has not been updated, in the presence of unreadable or erased sectors within a data cluster within the cluster block, the calculation of the C3-checks over the cluster block can be used to detect the cluster block inconsistency, avoiding miscorrection.

Encoding the virtual readability state of each data cluster into the C3-checks provides protection miscorrection in the presence of "jami" erasures.

The advantages of the present system are inherent in the structure of the ISF-ECC that protects against different error mechanisms, with different levels of protection. It allows reliable protection against error events that are rare, i.e., long defects or loss of a sector, a plurality of sectors, or clusters of sectors at the lowest possible overhead.

The present system is applicable as a raid on-drive, where the cluster block is the parity stripe, wherein the raid-on-drive level correction is verified by several underlying correction levels. The ISF-ECC makes the probability of miscorrection of the raid-on-drive correction level unlikely.

BRIEF DESCRIPTION OF THE DRAWINGS

The various features of the present invention and the manner of attaining them will be described in greater detail with reference to the following description, claims, and drawings, wherein reference numerals are reused, where appropriate, to indicate a correspondence between the referenced items, and wherein:

FIG. 4A represents an exemplary virtual readability byte encoded in a C3-check level;

DETAILED DESCRIPTION OF PREFERRED EMBODIMENTS

Figure 1:
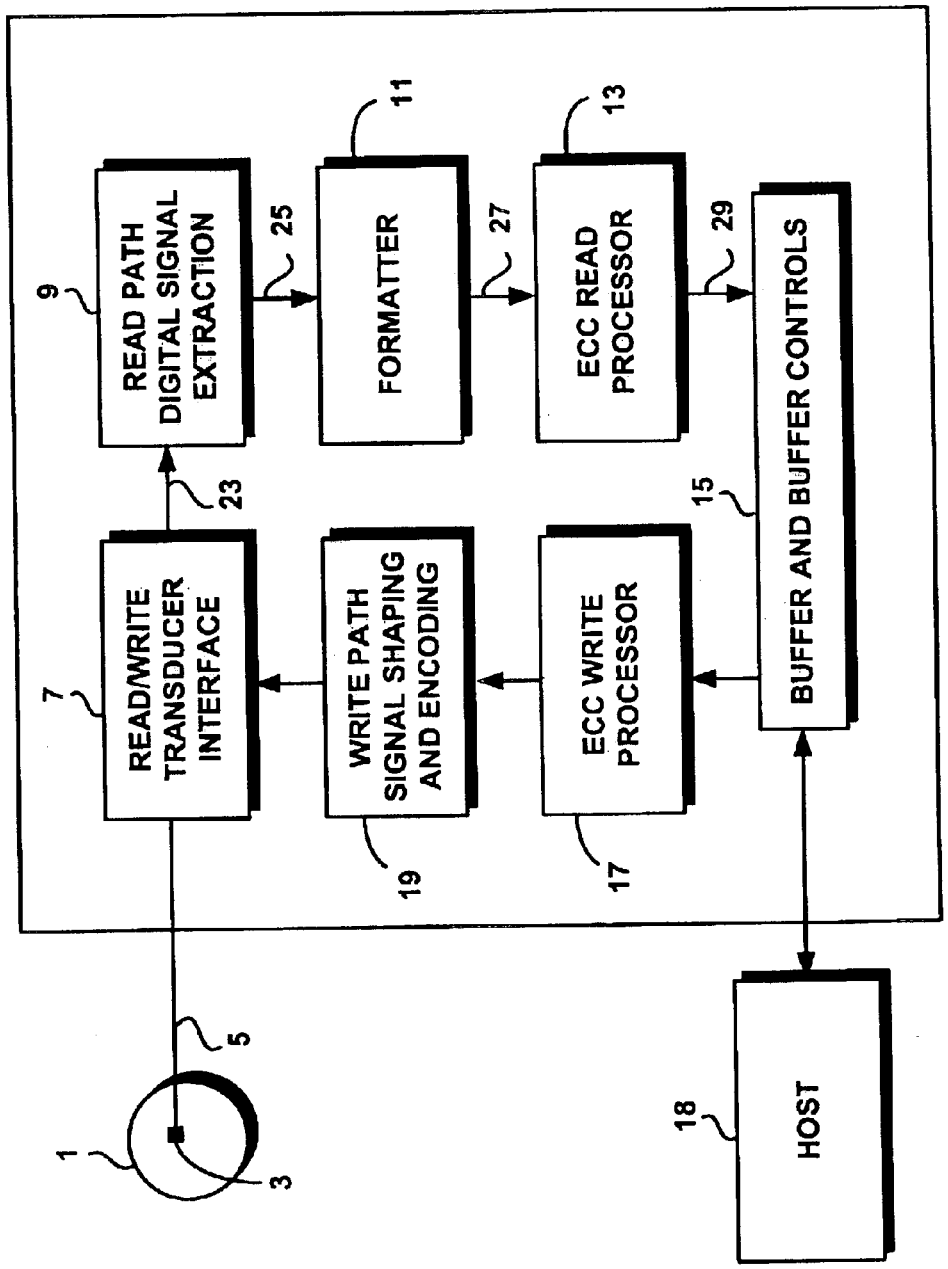
FIG. 1 illustrates a partial data flow for write and read paths of a hard disk drive (HDD) for an on-the-fly (OTF) calculation and appending of check bytes to form and record linear error correction code (ECC) codewords and for detection and correction of linear ECC codewords read from a disk's tracks, in accordance with the present invention.

FIG. 1 illustrates a partial logical view of a disk drive and a portion of the read path and the write path, in accordance with the prior art. A disk drive, also termed a direct access storage device, comprises a cyclically-rotated magnetic disk 1, a radial or axially movable access arm 5 tipped with an electromagnetic transducer 3 for either recording magnetic flux patterns representing sequences of digital binary codewords along any one of a predetermined number of concentric tracks on the disk, or reading the recorded flux patterns from a selected one of the tracks and converting them into codewords.

When sequences of digital binary data are to be written out to the disk 1, they are placed temporarily in a buffer 15 and subsequently processed and transduced along a write path or channel (17, 19, 7, 5, and 3) having several stages. First, a predetermined number of binary data elements, also termed bytes, in a data string are moved from the buffer and streamed through the error correction code (ECC) write processor 17. In processor 17, the data bytes are mapped into codewords drawn from a suitable linear block or cyclic code such as a Reed-Solomon (RS) code, as is well appreciated in the prior art. Next, each codeword is mapped in the write path signal-shaping unit 19 into a run length limited or other bandpass or spectral-shaping code and changed into a time-varying signal. The time-varying signal is applied through an interface 7 and thence to the write element in a magnetoresistive, or other suitable transducer 3, for conversion into magnetic flux patterns.

All of the measures starting from the movement of the binary data elements from buffer 15 until the magnetic flux patterns are written on a selected disk track as the rotating disk 1 passes under the head 3 are synchronous and streamed. For purposes of efficient data transfer, the data is de-staged (written out) or staged (read) a disk sector at a time. Thus, both the mapping of binary data into Reed-Solomon codewords and the conversion to flux producing time-varying signals must be done well within the time interval defining a unit of recording track length moving under the transducer. Typical units of recording track length are equal fixed length byte sectors of 512 bytes.

When sequences of magnetic flux patterns are to be read from the disk 1, they are processed in a separate so called read path or channel (7, 9, 11, and 13) and written into buffer 15. The time-varying signals, sensed by transducer 3, are passed through the interface 7 to a signal extraction unit 9. Here, the signal is detected and a decision is made as to whether it should be resolved as a binary 1 or 0. As these 1's and 0's stream out of the signal extraction unit 9 over path 25, they are arranged into codewords in the formatting unit 11. Since the read path is evaluating sequences of RS codewords previously recorded on disk 1, then, absent error or erasure, the codewords should be the same.

In order to test whether that is the case, each codeword is applied to the ECC read processor 13 over a path 27 from the formatter. Also, the sanitized output from the ECC processor 13 is written into buffer 15 over path 29. The read path must also operate in a synchronous data streaming manner such that any detected errors must be located and corrected within the codeword well in time for the ECC read processor 13 to receive the next codeword read from the disk track. The buffer 15 and the read and write paths may be monitored and controlled by a microprocessor (not shown) to ensure efficacy where patterns of referencing may dictate that a path not be taken down, such as sequential read referencing.

Figure 2:
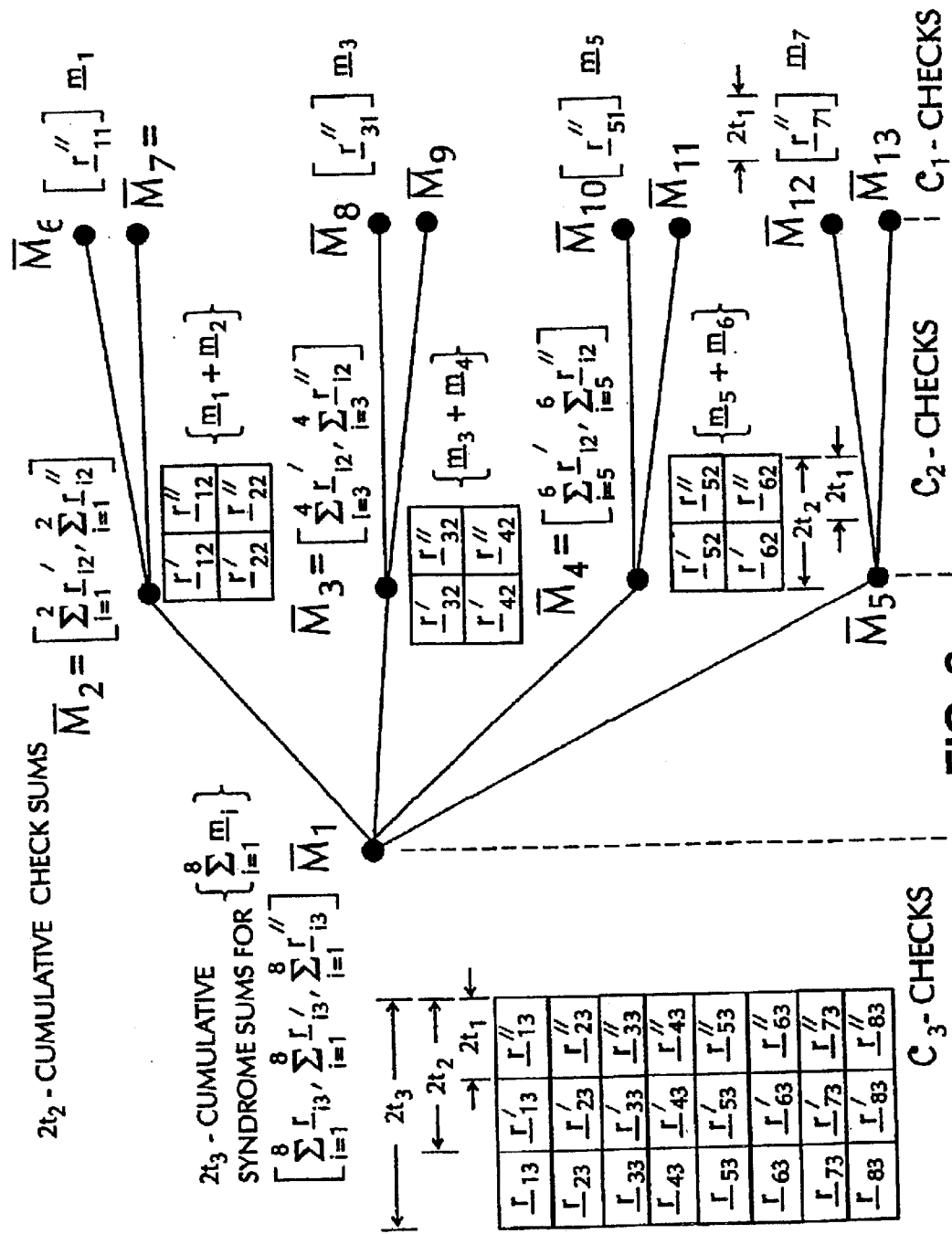
FIGS. 2 and 3 illustrate a method and an apparatus for ML-ISF-ECC encoding for a particular example of N=8 sectors, n=3 levels, in accordance with an embodiment of the present invention.
Figure 3:
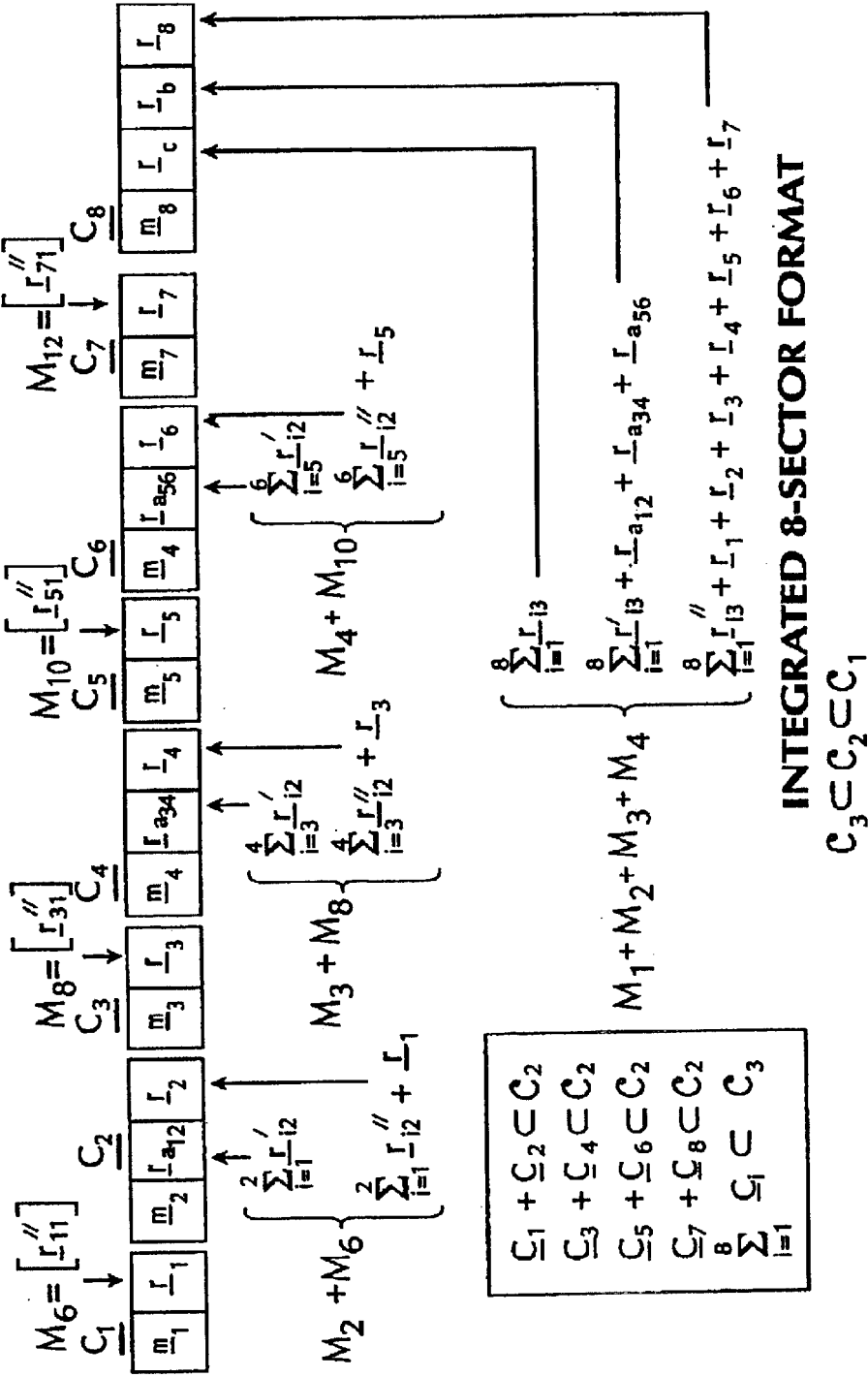

FIGS. 2 and 3 illustrate a method and an apparatus for ML-ISF-ECC encoding for a particular example of N=8 sectors, a three level ECC (n=3), in accordance with a preferred embodiment of the present invention. More particularly, FIG. 2 illustrates, at each node of the binary tree, the registers used to store the cumulative check sums. Likewise, FIG. 3 illustrates how the content of these registers is combined to generate the integrated format checks using explicit equations for each of the check byte sets.

The example of FIGS. 2 and 3 is illustrated, without limitation, to demonstrate that the present ML-ISF-ECC method for encoding and decoding is completely general and valid for any number, N, of integrated sectors, for any number, n, of ECC levels, and for any desired pattern for combining sectors within a physical block of N sectors to provide shared check bytes in a ML-ISF-ECC encoding and decoding scheme.

In a preferred embodiment of the present invention, the implementation of a Reed-Solomon encoder and decoder is a matter of design choice, as other encoding and decoding techniques may be used.

While the present invention has been described with respect to a disk storage device as an illustrative embodiment thereof, it will be understood that various changes may be made in the method and means herein described without departing from the scope and teaching of the invention. Thus, the principles of this invention also pertain to the detection and correction of errors in linearly error correction encoded long byte strings, such as received from a communication system or the like. In the communication system, the units of information are preferably referred to as packet of information rather than sectors of information, as both sectors and packets represent units of information having predetermined amounts of information.

Figure 4:
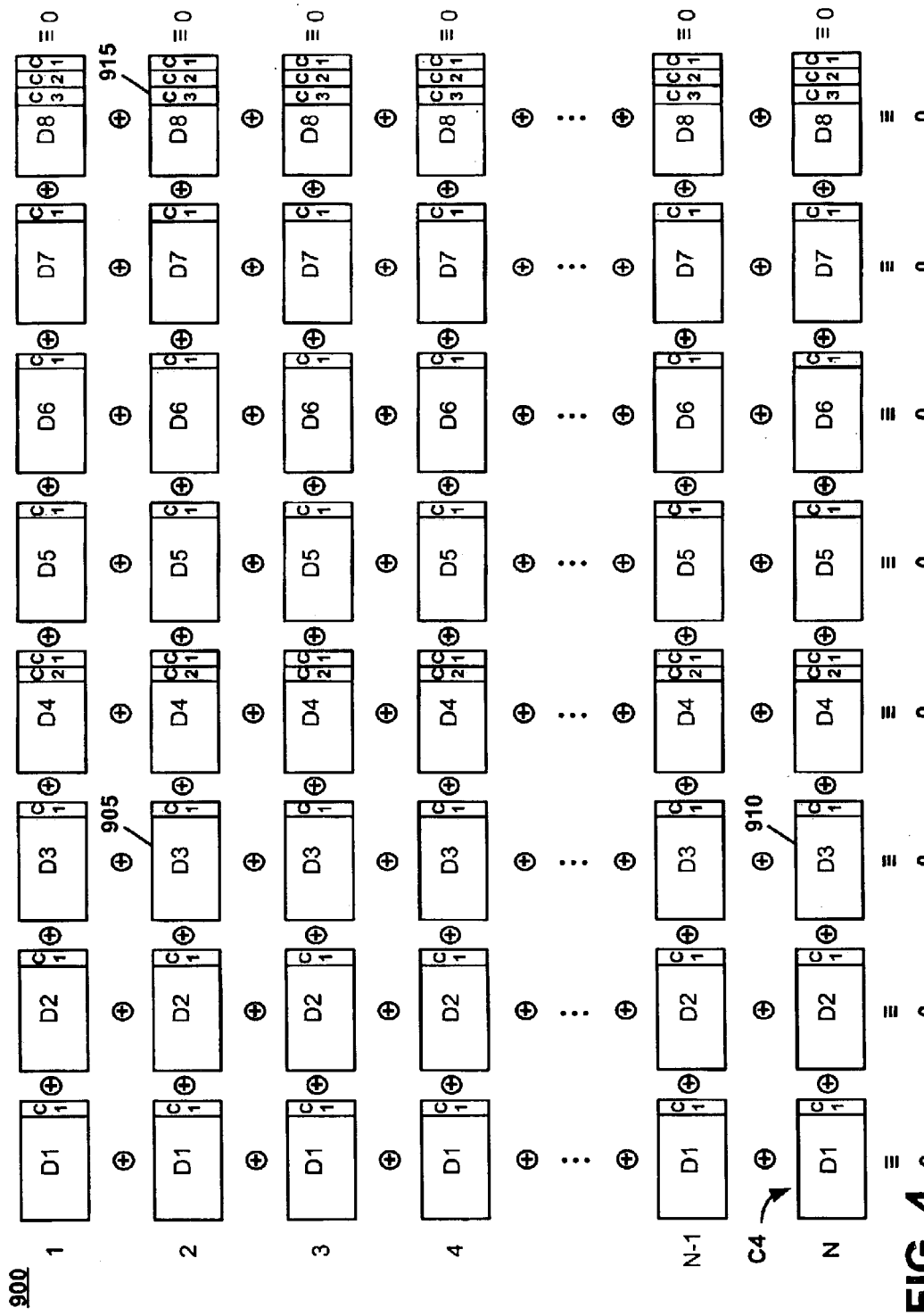
FIG. 4 is an exemplary cluster block containing a plurality of sector clusters with an additional C4-level parity cluster to provide added protection against miscorrection according to a preferred encoding method of the present invention.

Referring now to FIG. 4, it illustrates an exemplary cluster block 900 containing a plurality of data sector clusters 1, 2, 3, and 4 through N−1, with a parity cluster N (also referred to as parity cluster C4). Parity cluster C4 is added to provide increased protection against sector erasure.

Though the present invention is described with reference to clusters and sectors, it should be clear that the present invention is applicable as well to stripes (or groups) of clusters.

To this end, the present system presents the cluster block 900 that is protected by the parity cluster C4, which itself is a complete, C3-protected cluster. Effectively, this protection forms a fourth ISF protection level, which is implemented as a multi-sector parity stripe on a cluster block. More specifically, parity cluster C4 is protected by C1, C2, and C3 protection levels, similarly to the other clusters 1 through N, as described earlier.

Considering an 8-sector cluster as an example, the parity cluster, or C4-check protection level, also has similar protection levels, C1, C2, C3, as the data sectors 1 through N−1, and is formed as follows.

The exclusive OR (XOR) sum of the data, $D_i$, i=1, ..., 8, of all the sectors 1–N, including the parity cluster C4 in cluster block 900, equals zero, as expressed below:

$$\sum_{j=1}^{N} D_{i,j} \equiv 0, \ i = 1, \ldots, 8.$$

Similarly, the exclusive OR (XOR) sum of the C1-check protection level, $C_i$, i=1, ..., 8, of all the sectors 1–N, including the parity cluster C4 in cluster block 900, equals zero, as expressed below:

$$\sum_{j=1}^{N} C_{i,j} \equiv 0, \ i = 1, \ldots, 8.$$

Considering the second column by way of example, the exclusive OR (XOR) sum of the data, D2, of all the sectors 1–N, including the parity cluster C4, in the second column in cluster block 900, equals zero, as expressed below:

$$\sum_{j=1}^{N} D_{2,j} \equiv 0.$$

A similar XOR summation applies to all the data sections, $D_i$, in the cluster block 900.

The exclusive OR (XOR) sum of the C2-check protection level of all the sectors 1–N, including the parity cluster C4, in the fourth column in cluster block 900, equals zero, as expressed below:

$$\sum_{j=1}^{N} C_{2,j} \equiv 0.$$

Similarly, the exclusive OR (XOR) sum of the C3-check protection level of all the sectors 1–N, including the parity cluster C4, in the eight column in cluster block 900, equals zero, as expressed below:

$$\sum_{j=1}^{N} C_{3,j} \equiv 0.$$

As a result, the present system uses the C2 and C3 protection levels as cycle redundancy checks (CRC's) for the parity cluster C4.

In addition, and with further reference to FIG. 4A, one feature of the present invention is the inclusion of a virtual readability byte 920 for each cluster in the cluster block 900. The virtual readability byte 920 is not written on the disk, but is encoded into the C3-check.

In the example of FIG. 4, as the 8-sector cluster (such as cluster 2 that contains the unreadable sector 905) is read, a corresponding readability byte 920 (FIG. 4A) is generated, in which each bit describes the readability state of the corresponding sector.

In this example, the first bit 921 in the readability byte 920 corresponds to sector D1 in cluster 2; the second bit 922 corresponds to sector D2; the third bit 923 corresponds to sector D3 (905); the fourth bit 924 corresponds to sector D4; the fifth bit 925 corresponds to sector D5; the sixth bit 926 corresponds to sector D6; the seventh bit 927 corresponds to sector D7; and the eight bit 928 corresponds to sector D8. The zero bit indicates that the corresponding sector is readable, while a one bit (as in sector 905) indicates that the corresponding sector is not readable (or has been erased).

Figure 5:
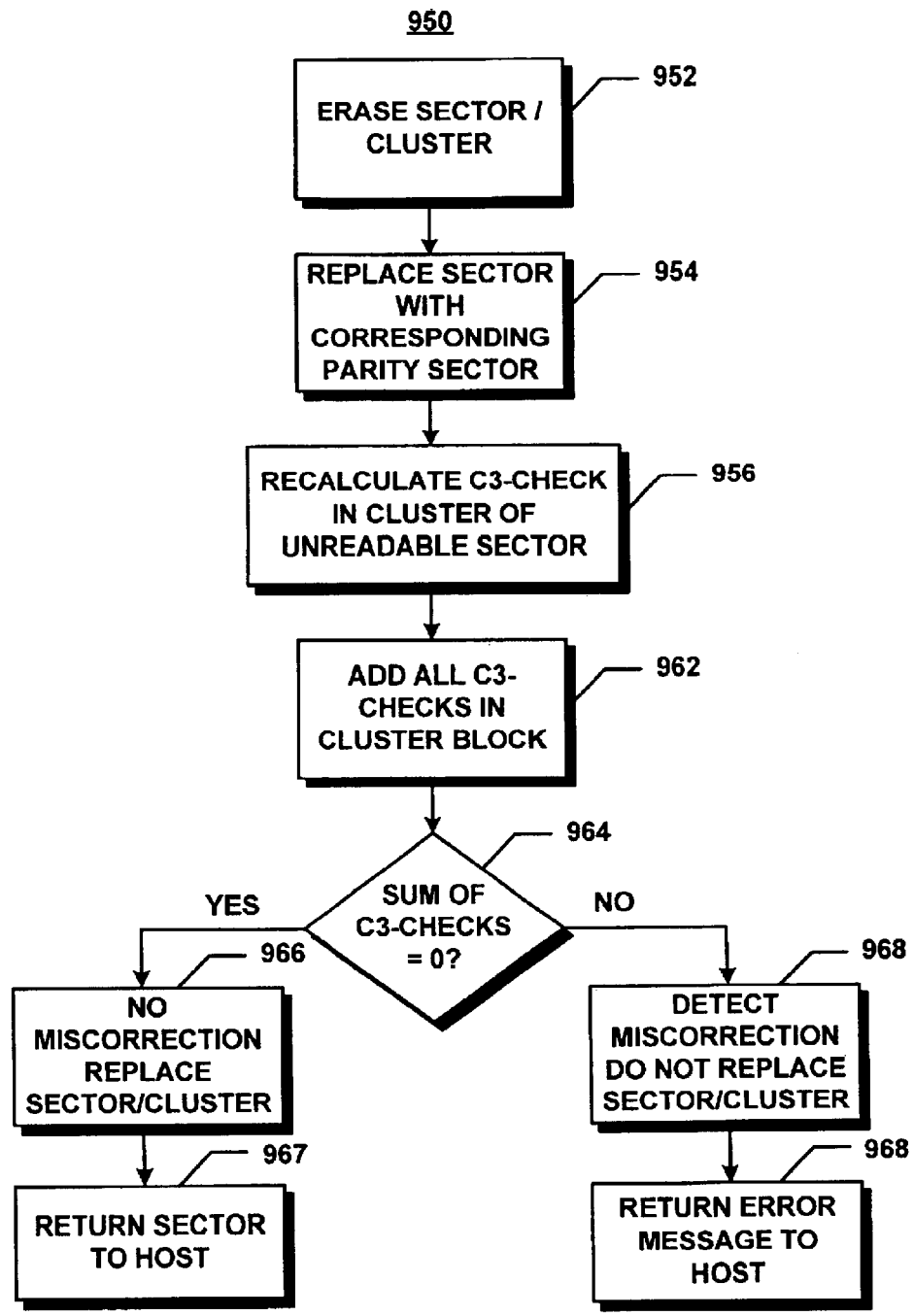
FIG. 5 is a process flow chart that illustrates the encoding method for generating the C4-level parity cluster protection of FIG. 4.

FIG. 5 is a process flow chart that illustrates an encoding method (i.e., code or algorithm) 950 for generating the C4-level parity cluster protection of FIG. 4. Method 950 is initiated in step 952 by an unreadable or erased sector or sectors, such as by an erasure, whether partial or complete of one or more sectors in the cluster block 900.

In step 954, method 950 replaces the unreadable or erased sector, i.e., 905 (FIG. 4) with the corresponding parity sector, i.e., 910, in the parity cluster C4. Method 950 then recalculates the C3-checks 915 in the cluster (i.e., cluster 2) of the unreadable or erased sector 905.

In step 962, method 950 implements an exclusive OR operation (XOR) on the C3-checks in all the clusters 1 through N, including the parity cluster C4. Then, in step 964, method 950 checks if the XOR sum of the C3-check calculated in step 962 equal zero.

If in step 964 it is determined that the XOR sum of the C3-checks is equal to zero, method 950 proceeds to step 966 and replaces the unreadable or erased sector 905 with the corresponding parity sector 910. The parity sector 910 is then returned to a host 18 (FIG. 1) in step 967.

If, on the other hand, the XOR sum of the C3-checks is determined to be different from zero, method 950 proclaims a miscorrection in step 968, and does not replace the unreadable or erased sector 905 with the corresponding parity sector 910. An error message is returned to the host 18 in step 969. This return error message is a feature of the present invention in that the error message provides an administrator with the opportunity to, for example, manually correct the corrupt or unreadable sector, if so desired. The abstention from replacing the unreadable or erased sector 905 with the corresponding parity sector 910, also prevent error propagation that could otherwise go undetected for an extended period of time.

Figure 6:
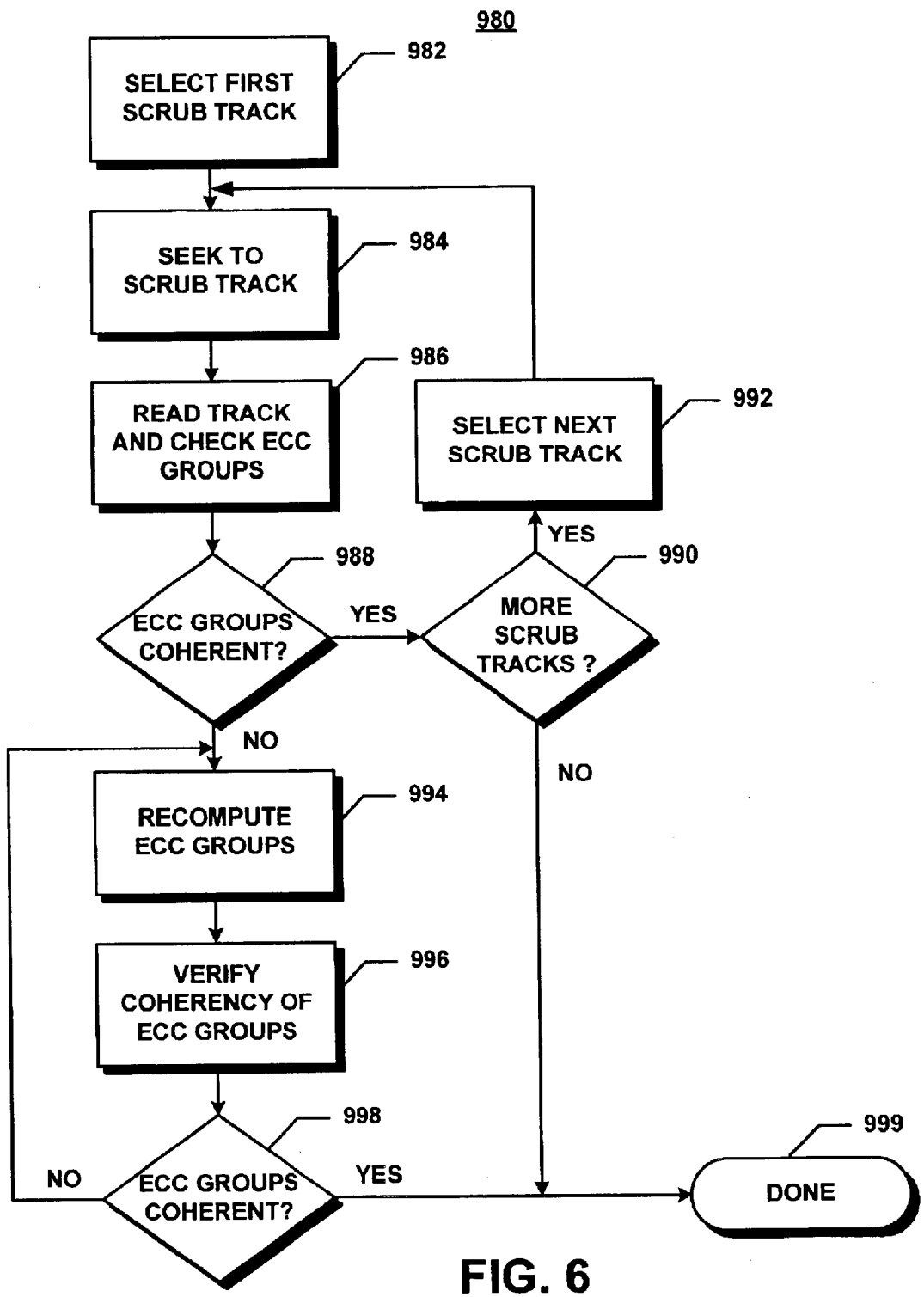
FIG. 6 is a process flow chart that illustrates a scrub update method according to a preferred method of the present invention.

Turning now to FIG. 6 is a process flow chart that illustrates a scrub update method 980 according to a preferred method of the present invention. The scrub update method 980 is preferably implemented during the idle time of the drive. Accordingly, while the C1-checks are written on-the-fly, the C2, C3, and C4-checks are calculated and checked by means of the scrub update method 980.

The scrub update method 980 is initiated in step 982 by selecting a first scrub track 982, and then, in step method 980 seeks to scrub the track. Method 986 then reads this track and checks the ECC groups, i.e., C2 groups, C3 groups, and C4 groups, in step 986.

In step 988, method 980 inquires if the ECC groups are coherent, that is if the individual XOR sums of these groups equal zero. If so, method 980 proceeds to decision step 990 and inquires if there exists more tracks to scrub.

If additional tracks are found to still exist in step 990, method 980 proceeds to step 992 and selects the next scrub track, and repeats steps 984, 986 and 988, as described earlier. If no additional scrub tracks are found in step 990, method 980 terminates in step 999.

Returning to step 988, if the ECC groups are not found to be coherent, method 980 proceeds to step 994 and recomputes the C2, C3, and C4-check groups, and then evaluates the coherency of the recomputed ECC groups in step 996.

If the coherency of the recomputed ECC groups is not verified in decision step 998, method 980 repeats steps 994 and 996 as described earlier. If, however, the coherency of the recomputed ECC groups is verified, method 980 is terminated in step 999.

It is to be understood that the specific embodiments of the invention that have been described are merely illustrative of certain application of the principle of the present invention. Numerous modifications may be made to the system and associated method described herein, without departing from the spirit and scope of the present invention. While the present invention has been described in connection with sectors for exemplification purpose, it should be clear that the present invention is applicable as well to any data sets or associated sets of data.

What is claimed is:

1. A method of protecting against miscorrection due to parity sector correction, comprising:
   generating sector level check bytes according to a multi-level error correction code;
   using at least some of the sector level check bytes to determine an occurrence of miscorrection due to parity sector correction;
   if miscorrection is detected preventing a replacement of any of an unreadable or erased sector with a corresponding parity sector; and
   if miscorrection is not detected replacing the any of an unreadable or erased sector with the corresponding parity sector.

2. The method of claim 1, further comprising generating cluster level check bytes according to the multi-level error correction code.

3. The method of claim 2, further comprising using at least some of the cluster level check bytes to determine the occurrence of miscorrection due to parity sector correction at a cluster level; and
   wherein if miscorrection is determined to have occurred, returning an error message.

4. The method of claim 1, wherein generating sector level check bytes comprises protecting each sector within a cluster against miscorrection, and cross checking for miscorrection within the cluster.

5. The method of claim 2, wherein generating sector level check bytes according to the multi-level error correction code comprises generating a four-level check: C1, C2, C3, and C4-ckecks.

6. The method of claim 5, wherein using at least some of the sector level check bytes to determine the occurrence of miscorrection due to parity sector correction comprises recalculating the C3-checks at the cluster level.

7. The method of claim 6, wherein using at least some of the sector level check bytes to determine the occurrence of miscorrection due to parity sector correction further comprises checking the integrity of the C3-checks that have been recalculated at the cluster level.

8. The method of claim 7, wherein checking the integrity of the C3-checks that have been recalculated at the cluster level comprises calculating a sum of all the C3-checks at a cluster block level.

9. The method of claim 8, wherein calculating the sum of all the C3-checks at the cluster block level comprises implementing an exclusive OR operation of all the C3-checks at the cluster block level.

10. The method of claim 9, wherein miscorrection is detected when the sum of all the C3-checks at the cluster block level is different from zero.

11. The method of claim 10, wherein miscorrection is not detected when the sum of all the C3-checks at the cluster block level is equal to zero.

12. The method of claim 2, further comprising calculating a readability byte for sectors in a cluster to indicate a readability state of the sectors.

13. The method of claim 12, wherein the readability byte is virtual.

14. The method of claim 13, further comprising encoding the virtual readability byte into a designated level of the multi-level error correction code.

15. The method of claim 2, further comprising calculating a readability byte for clusters in a cluster group to indicate a readability state of the clusters.

16. The method of claim 5, further comprising using a scrub update operation to generate the sector level check bytes, and to use at least some of the sector level check bytes to determine the occurrence of miscorrection due to parity sector correction.

17. The method of claim 16, wherein the scrub update operation is implemented during an idle time.

18. The method of claim 17, wherein using the scrub update operation comprises calculating at least some of the level checks during the idle time.

19. The method of claim 18, wherein calculating at least some of the level checks during the idle time comprises calculating the C2, C3, and C4-ckecks during the idle time.

20. The method of claim 19, further comprising calculating the C1-ckeck on-the-fly.

21. A storage device capable of protecting against miscorrection due to parity sector correction, comprising:
means for generating sector level check bytes according to a multi-level error correction code;
means for determining an occurrence of miscorrection due to parity sector correction by using at least some of the sector level check bytes;
wherein if the determining means detects miscorrection, the determining means prevents a replacement of any of an unreadable or erased sector with a corresponding parity sector; and
wherein if the determining means does not detect miscorrection, the determining means replaces the any of the unreadable or erased sector with the corresponding parity sector.

22. The storage device of claim 21, further comprising means for generating cluster level check bytes according to the multi-level error correction code.

23. The storage device of claim 22, further comprising means for using at least some of the cluster level check bytes to determine the occurrence of miscorrection due to parity sector correction at a cluster level.

24. The storage device of claim 21, wherein the means for generating sector level check bytes protects each sector within a cluster against miscorrection, and cross checking for miscorrection within the cluster.

25. The storage device of claim 22, wherein the means for generating sector level check bytes according to the multi-level error correction code generates a four-level check: C1, C2, C3, and C4-ckecks.

26. The storage device of claim 25, wherein the means for using at least some of the sector level check bytes to determine the occurrence of miscorrection due to parity sector correction recalculates the C3-checks at the cluster level.

27. The storage device of claim 26, wherein the means for using at least some of the sector level check bytes to determine the occurrence of miscorrection due to parity sector correction further checks the integrity of the C3-checks that have been recalculated at the cluster level.

28. The storage device of claim 27, wherein the means for checking the integrity of the C3-checks that have been recalculated at the cluster level calculates a sum of all the C3-checks at a cluster block level.

29. The storage device of claim 22, further comprising calculating a virtual readability byte for sectors in a cluster to indicate a readability state of the sectors.

30. The storage device of claim 25, further comprising a scrub update operation that generates the sector level check bytes and that uses at least some of the sector level check bytes to determine the occurrence of miscorrection due to parity sector correction.

31. A method of protecting a data set with at least one parity block against miscorrection due to inconsistent parity in the data set, comprising:
generating a cross check from information in the data set;
storing the cross check in association with the data set;
on an erasure event, reconstructing missing data from the parity block;
generating a new cross check from the data set including data that has been reconstructed;
comparing the new cross check with the stored cross check;
if the compared reconstructed and the new cross checks are consistent, determining that the reconstructed data is valid and allowing the reconstructed to be used; and
if the compared reconstructed and the new cross checks are not consistent, determining that the reconstructed data is invalid and indicating an error.

32. The method of claim 31, wherein generating the cross check comprises generating the cross check according to a multi-level error correction code.

33. The method of claim 31, wherein the data set comprises multiple parity sectors.

34. The method of claim 33, wherein generating the cross check comprises generating a parity sector over a subset of the data set.

35. The method of claim 34, wherein generating the cross check further comprises generating a plurality of cross checks from other subsets of the data set so that the other subsets include data from a plurality of unique parity data subsets.

36. A data storage device containing a data set protected with at least one parity block, the data set also being protected by a cross check stored in association with the data set, comprising:
means for generating the parity block from the data set;
means for generating a cross check from the data set;
means for reconstructing missing data from the parity block due to an erasure event;
means for generating a new cross check from the reconstructed data set;
means for comparing the new cross check with a stored cross check; and
means for indicating an error if the compared new cross check and stored cross check are not consistent.

37. The data storage device of claim 36, wherein the means for generating the cross check generates the cross check according to a multi-level error correction code.

38. The data storage device of claim 36, wherein the data set comprises multiple parity sectors.

39. The data storage device of claim 38, wherein the means for generating the cross check generates a parity sector over a subset of the data set.

40. The data storage device of claim 39, wherein the means for generating the cross check further generates a plurality of cross checks from other subsets of the data set so that the other subsets include data from a plurality of unique parity data subsets.

41. An error correction code having instruction codes and containing a data set protected with at least one parity block, the data set also being protected by a cross check stored in association with the data set, comprising:

- a first set of instruction codes for generating the parity block from the data set;
- a second set of instruction codes for generating a cross check from the data set;
- a third set of instruction codes for reconstructing missing data from the parity block due to an erasure event;
- the third set of instruction codes further generating a new cross check from the reconstructed data set; and
- the third set of instruction codes comparing the new cross check with a stored cross check, and for indicating an error if the compared new cross check and stored cross check are not consistent.

42. The error correction code of claim 41, wherein the second set of instruction codes generates the cross check according to a multi-level error correction code.

43. The error correction code of claim 41, wherein the data set comprises multiple parity sectors.

44. The error correction code of claim 43, wherein the second set of instruction codes generates a parity sector over a subset of the data set.

45. The error correction code of claim 44, wherein the second set of instruction codes further generates a plurality of cross checks from other subsets of the data set so that the other subsets include data from a plurality of unique parity data subsets.

* * * * *